(12) United States Patent
Oh (10) Patent No.: US 6,421,099 B1
(45) Date of Patent: Jul. 16, 2002

(54) AUTOMATIC FREQUENCY TRACKING APPARATUS AND METHOD FOR A TELEVISION SIGNAL RECEIVING SYSTEM

(75) Inventor: Ji-Sung Oh, Kyonggi-do (KR)

(73) Assignee: Samsung Electronics Co., Ltd., Kyungki-Do (KR)

( * ) Notice: Subject to any disclaimer, the term of this patent is extended or adjusted under 35 U.S.C. 154(b) by 0 days.

(21) Appl. No.: 09/444,576

(22) Filed: Nov. 19, 1999

(30) Foreign Application Priority Data

Nov. 28, 1998 (KR) .......................................... 98-51617

(51) Int. Cl.⁷ ................................................ H04N 5/50
(52) U.S. Cl. ........................ 348/732; 348/735; 348/731
(58) Field of Search ................................ 348/731, 732, 348/735, 720

(56) References Cited

U.S. PATENT DOCUMENTS

| | | | | |
|---|---|---|---|---|
| 4,405,947 A | * | 9/1983 | Tults et al. .................. | 348/731 |
| 4,575,761 A | * | 3/1986 | Carlson et al. ............. | 348/731 |
| 5,739,874 A | * | 4/1998 | Badger et al. .............. | 348/731 |
| 5,982,457 A | * | 11/1999 | Limberg ...................... | 348/725 |
| 6,021,165 A | * | 2/2000 | Ohkubo et al. ............. | 375/344 |

* cited by examiner

Primary Examiner—Victor R. Kostak
(74) Attorney, Agent, or Firm—Sughrue Mion, PLLC (57) ABSTRACT

An automatic frequency tracking apparatus and method for a receiver for receiving a television signal including a pilot signal which can automatically track and compensate for the frequency offset of the received television signal even in a case where the frequency offset deviates from a determined range in which carrier restoration is possible. According to the method, a maximum frequency offset range which can occur in receiving a television signal is divided into a plurality of window regions, and each window region is searched to determine if a lock signal of a frequency phase-locked loop is detected at representative frequencies of the respective divided window regions in a wide-range tracking adjustment mode performing step. Thereafter, a fine-tuning adjustment mode is performed so that the respective frequencies existing in the window regions in which the lock signal is detected are determined as tuned frequencies, and if a frequency offset detected from the determined tuned frequencies has a value in a predetermined range, the corresponding tuned frequency is determined as an optimum tuned frequency.

9 Claims, 6 Drawing Sheets

AUTOMATIC FREQUENCY TRACKING APPARATUS AND METHOD FOR A TELEVISION SIGNAL RECEIVING SYSTEM

BACKGROUND OF THE INVENTION

1. Field of the Invention

The present invention relates generally to a television signal receiving system. In particular, the present invention relates to an automatic frequency tracking apparatus and a method for a television signal receiving system which can automatically track the frequency offset of a received digital television signal even in a case where the frequency offset deviates from a determined range in which carrier restoration is possible.

2. Description of the Related Art

In receiving a digital television signal, there usually exists a frequency offset between various frequency oscillators used in transmitting a television signal and a frequency synthesizer of a receiving tuner. In an ideal case, since an allowable error of the oscillators used in transmitting/receiving the television signal is within the range of several kilohertz (KHz), the frequency offset of the received signal detected in a television receiver exists within a range of several tens of KHz. In the actual television radio wave transmitting/receiving environments, however, the frequency offset of the received signal may be in the range of several hundreds KHz due to deterioration of the appliance or parts thereof. Accordingly, a digital television signal receiving system is required to track and compensate for the frequency offset of the received signal.

Frequency tracking is the technique of tracking and compensating for frequency offset if the received signal deviates from the original received frequency and where the frequency offset is due to various reasons during transmission of television signal. Automatic frequency tracking (AFT) methods, which have been adopted in the television receiver, may be classified according to the television receiving system as follows.

In a general analog television receiver, a voltage signal is produced in proportion to the difference between the frequency value of the visual carrier of the received signal and the frequency value of the frequency synthesizer in the receiving tuner, which are in an intermediate frequency (IF) band., The voltage signal is used to determine the value of the frequency offset of the present received signal. Then, the detected frequency offset value is transferred to a microcomputer in the receiver, so that the microcomputer compensates for the frequency offset by adjusting the frequency of the frequency synthesizer to reduce the frequency offset value. In the general analog television receiver, an allowable range of the frequency offset in which tracking is possible is −1.5 MHz~2.0 MHz.

Figure 1:
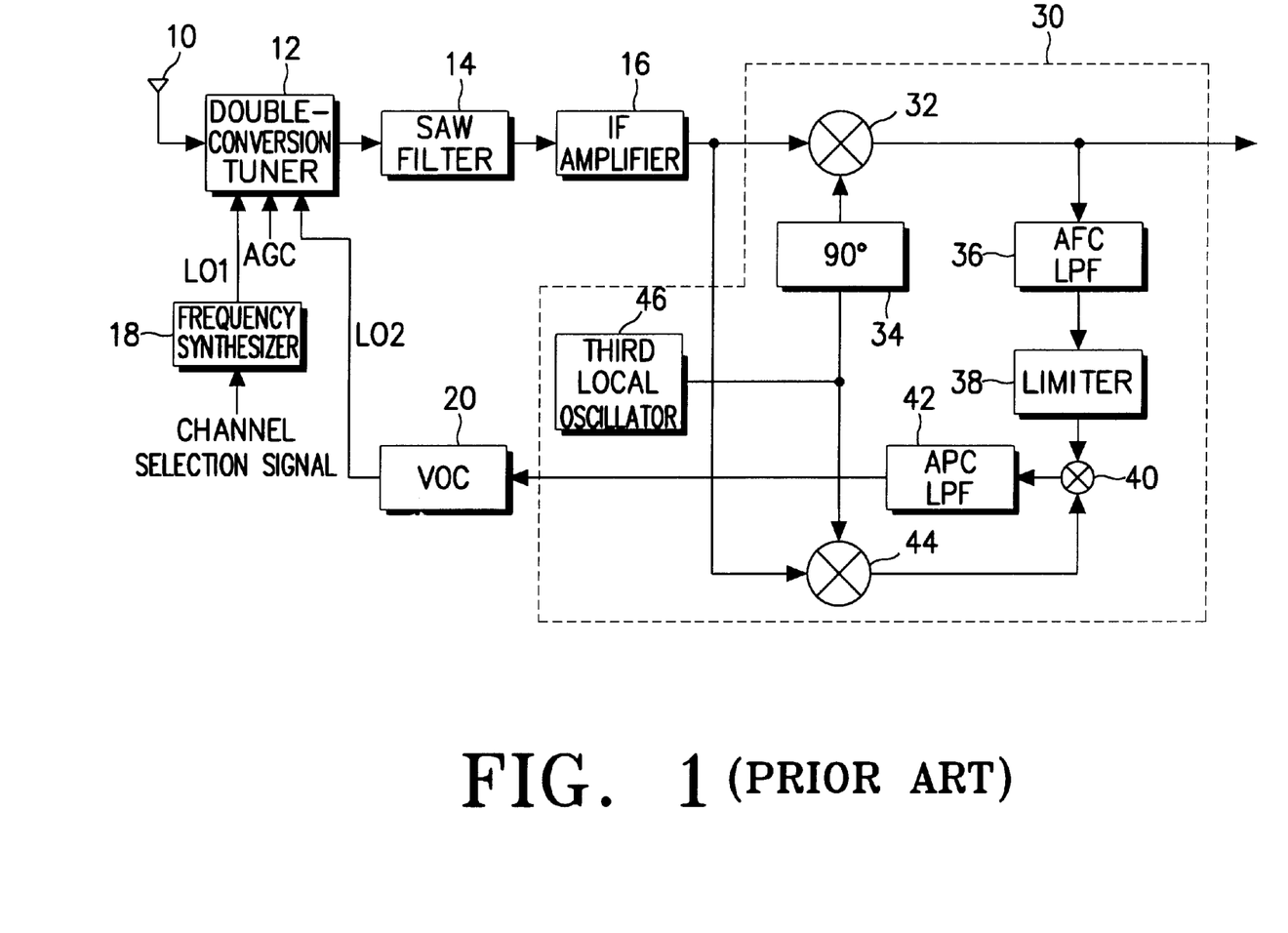
FIG. 1 is a schematic circuit diagram of a general frequency offset compensating circuit.

A vestigial side band (VSB) type television receiver currently proposed in the United States has a frequency offset compensating circuit as shown in FIG. 1, and performs the frequency tracking as mentioned above.

The general frequency offset compensating circuit of FIG. 1 has already been proposed by Zenith, and is disclosed in "Guide to the Use of the ATSC Television Standard A/54", published by United States Advanced Television System Committee in 1995. According to the frequency offset compensating circuit of FIG. 1, the received signal is first demodulated to a baseband signal, and the frequency offset value is computed using an AFC low pass filter (LPF) 36 and an automatic phase control (APC) LPF 42 for filtering the baseband signal. Then, the frequency tracking and carrier restoration are performed completely by varying the frequency of a double-conversion tuner 12 in accordance with the output value of the APC LPF 42.

Figure 2:
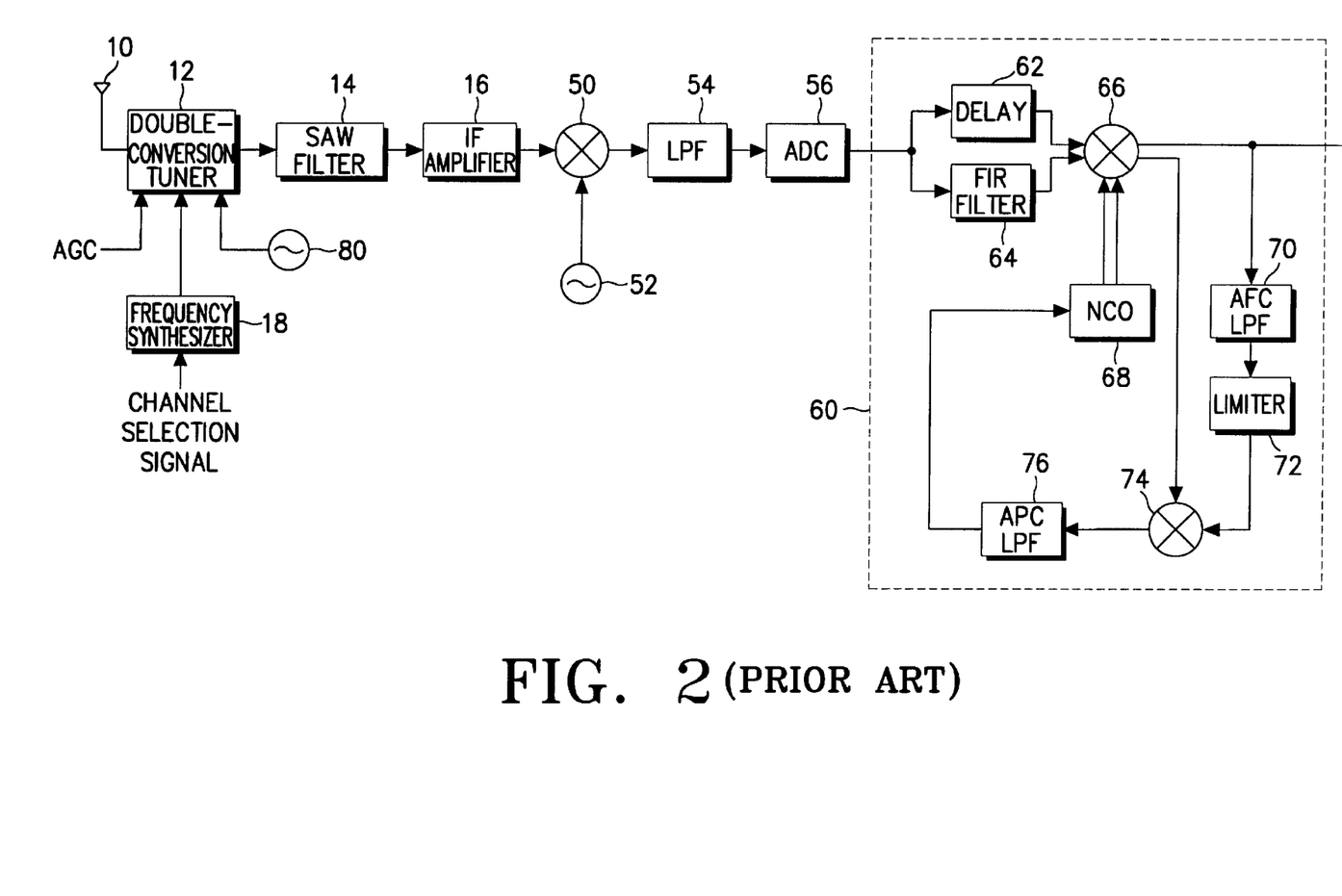
FIG. 2 is a block diagram illustrating a partial construction of a general digital television receiver for restoring a carrier.

FIG. 2 is a block diagram illustrating a partial construction of a general digital television receiver which restores the carrier with the digital compensation of the frequency offset. Such a digital television receiver is disclosed in detail in Korean Patent Application No. 95-20772 filed by the applicant of the present invention. According to the digital television receiver of FIG. 2, since the carrier restoration is performed after an analog-to-digital (A/D) conversion of the television signal, the oscillation frequency of a second local oscillator 80 in the double-conversion tuner 12 is fixed, and the frequency offset is compensated for by a numerically controlled oscillator (NCO) 68 provided following an analog-to-digital converter (ADC) 56.

As described above, various kinds of automatic frequency tracking methods are employed in the television receiver. However, all the methods have drawbacks in that their carrier-restoration performance is superior in a case where the frequency offset value is relatively small, but it is degraded considerably in a case where the frequency offset value becomes greater than ±300 KHz. Specifically, if the frequency offset value becomes greater, a surface acoustic wave (SAW) filter in the receiver suffers from the loss of the received signal, and thus the carrier restoration itself cannot be performed.

SUMMARY OF THE INVENTION

It is an object of the present invention to solve the problems involved in the related art, and to provide an automatic frequency tracking apparatus and method for a digital television signal receiving system which can automatically track the frequency offset of a received digital television signal even in a case where the frequency offset deviates from a determined range in which the carrier restoration is possible.

It is another object of the present invention to provide an automatic frequency tracking apparatus and method for a digital television signal receiving system which can improve the receiving performance of the system.

In order to achieve the above objects, there is provided an automatic frequency tracking method for a television signal receiving system for restoring a carrier including a pilot signal, comprising:

a window region dividing step of dividing a maximum frequency offset range which can occur in receiving a television signal into a plurality of window regions;

a wide-range tracking adjustment mode performing step of searching whether a lock signal of a frequency phase-locked loop is detected at representative frequencies of the respective divided window regions; and a fine-tuning adjustment mode performing step of determining the respective representative frequencies existing in the window regions in which the lock signal is detected as tuned frequencies, and if a frequency offset detected from the determined tuned frequencies has a value in a predetermined range, determining the corresponding tuned frequency as an optimum tuned frequency.

BRIEF DESCRIPTION OF THE DRAWINGS

The foregoing and other objects, features and advantages of the present invention will become more apparent from the following detailed description when taken in conjunction with the accompanying drawings in which.

DETAILED DESCRIPTION OF THE PREFERRED EMBODIMENT

A preferred embodiment of the present invention will be explained in detail with reference to the accompanying drawings. In the following explanation, it is noted that the same elements are denoted as the same numerals in the drawings. Also, detailed explanation about the known function and construction, which may unnecessarily obscure the subject matter of the present invention, will be omitted.

Figure 3:
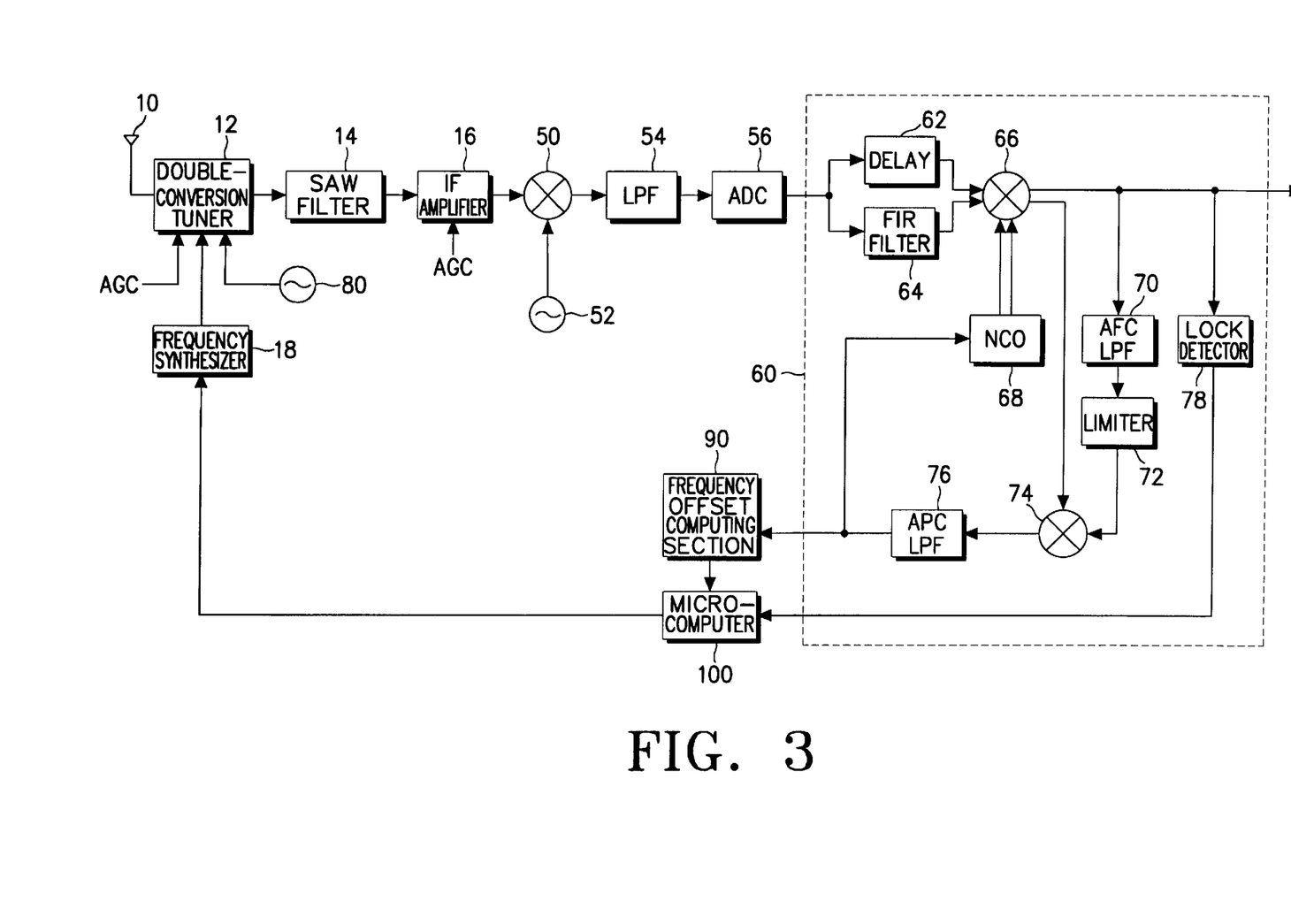
FIG. 3 is a block diagram illustrating a partial construction of a digital television receiver including an automatic frequency tracking apparatus according to an embodiment of the present invention.
Figure 4:
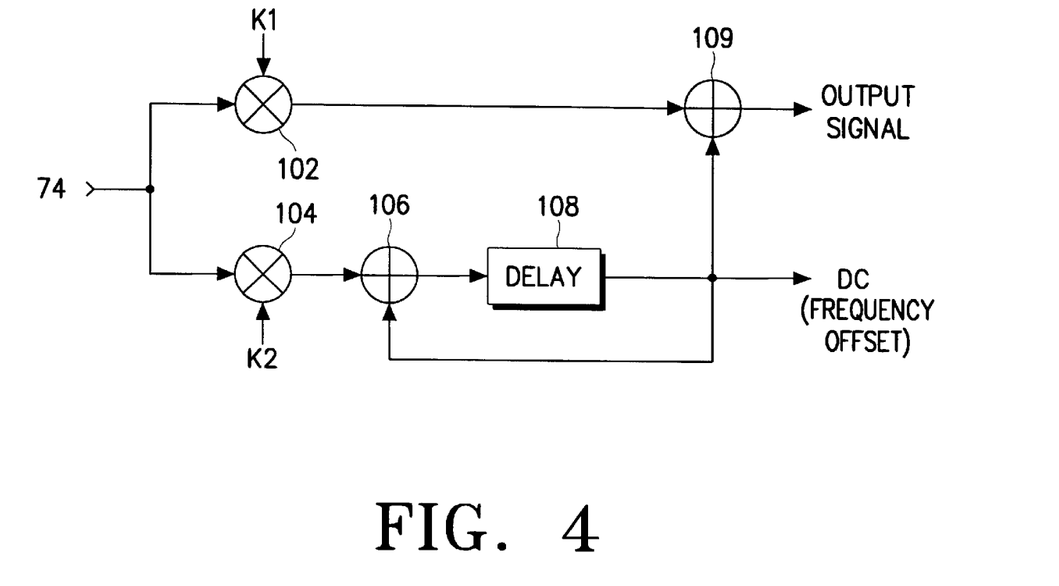
FIG. 4 is a circuit diagram of an APC LPF in FIG. 3.

FIG. 3 is a block diagram illustrating a partial construction of a digital television receiver including an automatic frequency tracking apparatus according to an embodiment of the present invention, and FIG. 4 is a circuit diagram of an APC LPF in FIG. 3.

Referring to FIG. 3, the construction and operation of the automatic frequency tracking apparatus according to the embodiment of the present invention will be explained.

The radio frequency (RF) signal received through an antenna 10 is applied to a double-conversion tuner (12). The double-conversion tuner 12 converts the received RF signal into a primary intermediate frequency (IF) signal having a band of 920 MHz by synthesizing the RF signal with a fixed local oscillation signal applied from a frequency synthesizer 18. At this time, the double-conversion tuner 12 also controls the gain of the output signal in response to an automatic gain control (AGC) signal of the receiver. The frequency synthesizer 18 generates and applies to the double-conversion tuner 12 the local oscillation signal corresponding to frequency adjustment data outputted from a microcomputer 100. The IF signal outputted from the double-conversion tuner 12 is filtered to an IF signal having a predetermined bandwidth through a surface acoustic wave (SAW) filter 14. The SAW filter 14 is a band pass filter for intercepting the input of an adjacent channel signal, and has a characteristic of filtering the IF signal within a bandwidth of 6 MHz. The IF signal having the bandwidth of 6 MHz, which passes through the SAW filter 14 is then amplified through an IF amplifier 16, and then applied to a mixer 50. The gain of the IF amplifier 16 is determined according to the AGC signal provided from the receiver.

The IF signal applied to the mixer 50 is mixed with the local oscillation signal generated from a third local oscillator 52, so that the frequency of the IF signal is down-converted into a signal neighboring the baseband. This down-converted signal passes through a low pass filter (LPF) 54 with its secondary harmonic component (video frequency component) removed, and is converted into a digital signal by an analog-to-digital converter (ADC) 56. Then, the converted digital signal is Hilbert-filtered through a finite impulse response (FIR) filter 64 in a carrier restorer 60 to be produced as an imaginary component of the received signal, while it passes through a delay 62 for matching with the delay time generated by the, FIR filter 64 to be produced as a real component of the received signal. The complex signal composed of the real component and the imaginary component is applied to a mixer 66 and multiplied by a complex signal of the fixed oscillation frequency from the NCO 68 to be frequency-converted into the baseband. The fixed oscillation frequency from the NCO 68 is determined as the frequency value for converting the pilot frequency of the input signal of the ADC 56 into the baseband signal.

An American type GA-HDTV signal includes a pilot signal for assisting the carrier restoration of the receiver. An AFC LPF 70 is used as a filter for detecting the difference between the frequency of the pilot signal and the frequency generated from the third local oscillator 52. If the frequency difference detected by the AFC LPF 70 is nearly zero, the output of the AFC LPF 70 becomes a positive or negative value (for example, +1 or −1) fixed by a limiter 72 following the AFC LPF 70. However, if the frequency difference detected by the AFC LPF 70 exists in some measure, the output of the limiter 72 becomes an alternation of +1 and −1. Such an alternating output of +1 and −1 outputted from the limiter 72 means that the carrier has a frequency offset, while the fixed value of +1 or −1 outputted from the limiter 72 means that the carrier has no frequency offset.

The output signal of the limiter 72 is then multiplied by the imaginary component outputted from the mixer 66 by a multiplier 74, and the output of the multiplier 74 is applied to the APC LPF 76, resulting in that the APC LPF 76 outputs a frequency offset value corresponding to the output of the multiplier 74. If the carrier has almost no frequency offset, i.e., if the difference between the carrier frequency and the demodulated frequency is nearly zero, the signal outputted from the limiter 72 to the multiplier 74 becomes the fixed positive or negative value. Accordingly, only the output of the mixer 66 affects the multiplier 74, and thus the carrier restorer 60 acts as a PLL circuit.

FIG. 4 illustrates the detailed construction of the APC LPF 76. Referring to FIG. 4, the reference numerals KI and K2 denote gain constants for determining the characteristic of a carrier restoring loop. An output of one path, which is composed of a multiplier 104 for multiplying the output of the multiplier 74 by the gain constant K2, an adder 106 for adding the output of the multiplier 104 to an output of a delay 108 following the adder 106, and a delay 108 for delaying an output of the adder 106 for a predetermined time, has a DC component. This DC component is used as a signal representing the degree of the frequency offset, and inputted to a frequency offset computing section 90 illustrated in FIG. 3. An output of another path, which is composed of a multiplier 102 for multiplying the output of the multiplier 74 by the gain constant K1, mainly includes an AC component. The DC and AC components are added together by an adder 109, and an added signal is outputted from the adder 109 as the output signal of the APC LPF 76. The DC component of the output signal is used as information for compensating for the frequency offset, and the AC component of the output signal is used as information for compensating for a phase component.

Meanwhile, the relationship between the output of the APC LPF 76 and the frequency offset is represented by an "S"-shaped curve centering around a zero point. Specifically, within a specified range, the output (DC component) of the APC LPF 76 is in proportion to the frequency offset, and in case of exceeding over the specified range, the output of the APC LPF 76 is decreased. Using this property, a table is made by corresponding the outputs of the APC LPF 76 to the frequency offset values one by one, and thus the microcomputer 100 recognizes the present frequency offset degree from the output of the APC LPF 76. The frequency offset computing section 90 in FIG. 3 comprises a ROM table where the frequency offset values are set according to the outputs of the APC LPF 76, but it may be implemented by a multiplier for multiplying the outputs of the APC LPF 76 by a specified coefficient and outputting multiplied values to the microcomputer 100.

Figure 6:
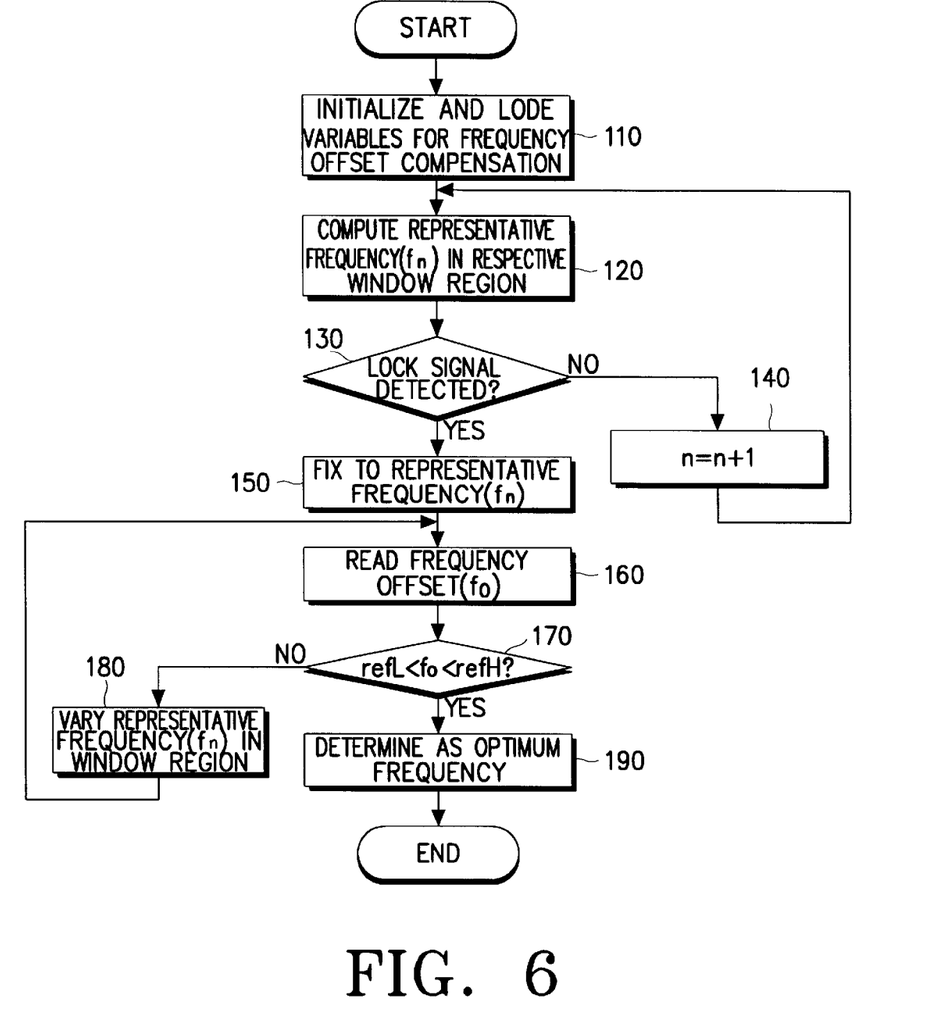
FIG. 6 is a flowchart illustrating an automatic frequency tracking method according to an embodiment of the present invention.

A lock detector 78 produces a 'high'-level lock signal to the microcomputer 100 if the frequency of the pilot signal included in the carrier coincides with the fixed oscillation frequency from the NCO 68. The microcomputer 100 stores therein an automatic frequency tracking control program according to the embodiment of the present invention, and performs an automatic frequency tracking operation with respect to the received television signal in accordance with the control program. For instance, the microcomputer 100 performs the tracking operation for the automatic compensation of the frequency offset by successively performing a wide-range tracking adjustment mode and a fine-tuning adjustment mode whenever the power is supplied to the television receiver or the channel is changed. The term "wide-range tracking adjustment mode" means a mode for performing a rough tracking operation by dividing a maximum frequency offset range which can occur in receiving the television signal into a plurality of window regions and then by searching whether the lock signal is detected at representative frequencies ($f_n$) of the respective divided window regions. The term "fine-tuning adjustment mode" means a mode for tuning the tuner with a frequency having the smallest frequency offset value in the window regions for which the wide-range tracking adjustment is completed. FIG. 6 illustrates the wide-range tracking adjustment mode and the fine-tuning adjustment mode which are performed in association with each other.

Figure 5:
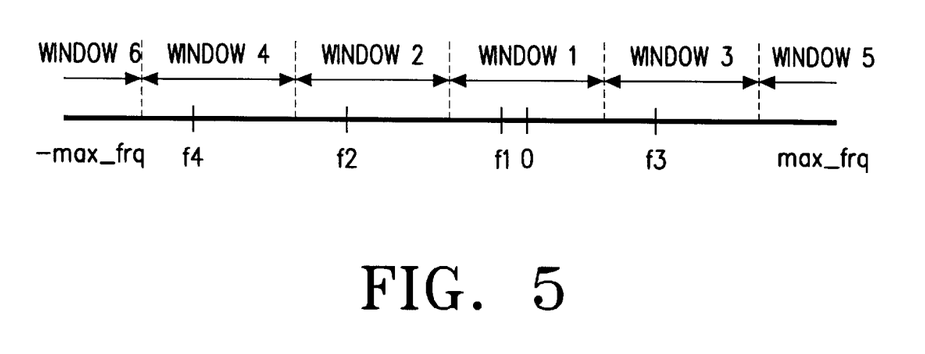
FIG. 5 is a view exemplifying window regions in a wide-range tracking adjustment mode according to an embodiment of the present invention.

FIG. 5 is a view exemplifying the window regions in the wide-range tracking adjustment mode according to the embodiment of the present invention, and FIG. 6 is a flowchart illustrating the automatic frequency tracking method according to the embodiment of the present invention.

Hereinafter, the automatic frequency tracking method according to the embodiment of the present invention will be explained in detail with reference to FIGS. 3, 5 and 6.

In the embodiment, the maximum frequency offset range ($-\max_{13}frq$ to $\max_{13}frq$) which may occur in receiving the television signal is divided into a plurality of (i.e., six) window regions. The divided window regions are numbered (i.e., window 1, window 2, ...) to determine their priorities for the search operation. Specifically, the numbering of the window regions is made in the order of their adjoining degrees to the control frequency (0 Hz) of the maximum frequency offset range. Preferably, the size of the respective window region is determined as a value which is smaller than the value of the carrier restoration range of the frequency phase-locked loop (DPLL), but which is larger than a half value of the carrier restoration range. It is by reason that if the window region is determined so as to exceed the carrier restoration range of the DPLL, the DPLL does not operate normally, which if the window region is determined too small, the time for performing the wide-range tracking adjustment mode is delayed.

In each window region in FIG. 5 exists a representative frequency ($f_n=f_1, f_2, f_3, f_4$). The computing process of such a representative frequency ($f_n$) will be explained later with reference to FIG. 6. The microcomputer 100 outputs to the frequency synthesizer 18 the frequency adjustment data for adjusting the output frequency of the frequency synthesizer 18 to the computed representative frequency ($f_n$), and accordingly, the frequency synthesizer 18 generates and applies to the double-conversion tuner 12 the local oscillation signal corresponding to the adjustment data. The double-conversion tuner 12 performs a tuning operation based on the local oscillation signal.

Referring to FIG. 6, the wide-range tracking adjustment mode and the fine-tuning adjustment mode, which constitute the automatic frequency tracking method according to the embodiment of the present invention, will be explained in detail.

If the power is supplied to the television receiver or the channel is changed during the power supply, the microcomputer 100 initializes and loads the variables (n, ΔH refH, refL) for compensating for the frequency offset (step 110). The variables are required for computing the representative frequency ($f_n$) in the respective window region. The term "n" is initially set to "1". The term "n" represents a positive integer that is varied to designate the search order of the respective window regions, and "ΔH" represents the width of frequency variation in the wide-range tracking adjustment mode. The terms "refH (reference HIGH)" and refL (reference LOW)" represent predetermined values to check whether the frequency offset ($f_o$) value inputted corresponding to the output of the APC LPF 76 is a value near "O". The values of ΔH, refH and refL are stored in a memory built in the microcomputer 100, and loaded to be used when the microcomputer 100 is initialized.

The microcomputer 100, after being initialized, computes the representative frequency ($f_n$) of the respective window region based on the following expression, equation (1) (step 120):

$$f_n = W_0 + a_n \Delta W \quad (1)$$

where $f_n$ denotes a representative frequency, $W_0$ denotes an initial frequency of the frequency synthesizer 18, and $a_n$ denotes a series which represents the order of the window search in the wide-range tracking adjustment mode, and has the value of 0, -1, 1, -2, 2, . . .

Accordingly, the representative frequency $f_1$ of the window region 1, which is first computed at step 120, becomes $W_0$. If it is assumed that the initial frequency $W_0$ of the frequency synthesizer 18 has a negative (-) value, the representative frequency $f_1$ would be positioned with an inclination to the left of the reference frequency (0 Hz) as shown in FIG. 5.

Then, the microcomputer 100, after the computation of the representative frequency $f_1$ in the window region 1, outputs the frequency adjustment data so that the representative frequency $f_1$ is oscillated from the frequency synthesizer 18. Thereafter, the microcomputer 100 checks whether the lock signal in an active state is detected from the lock detector 78 (step 130), and successively computes the representative frequencies ($f_2, f_3, f_4$) of the respective window regions as increasing "n" until the lock signal is detected, i.e., as changing the window regions to be searched. The microcomputer 100 outputs the adjustment data so that the oscillation frequency of the frequency synthesizer 18 is adjusted to the respective computed representative frequency. Such processes as above are performed by repeating the steps 120 to 140 in FIG. 6. If the lock signal is detected in any window region, the microcomputer 100 fixes the representative frequency ($f_n$) computed at step 120 (step 150), and then converts the present mode to the fine-tuning adjustment mode. Steps 110 to 150 constitute the wide-range tracking adjustment mode, and the following steps constitute the fine-tuning adjustment mode.

Now, the operation of the fine-tuning adjustment mode will be explained on the assumption that the fixed representative frequency is $f_2$ at step 150. The microcomputer 100 reads the frequency offset ($f_o$) value from the frequency offset computing section 90, i.e., from the ROM table (step 160). Since the output value of the APC LPF 76 is in proportion to the local oscillation frequency of the NCO 68 and the frequency offset of the received VSB signal, the frequency offset ($f_o$) value read out at step 160 is in proportion to the output value of the APC LPF 76. Then, the microcomputer 100 checks whether the read frequency offset ($f_o$) value is within the predetermined range of refL<$f_o$<refH (step 170). If the read frequency offset ($f_o$) value is not in the predetermined range as a result of checking, the microcomputer 100 outputs the frequency adjustment data so that the representative frequency ($f_n$) value is varied step by step to decrease the frequency offset value in the same window region (step 180). Thereafter, the microcomputer 100 reads the frequency offset ($f_o$) value corresponding to the output value of the APC LPF 74 based on the varied representative frequency ($f_n$), and repeatedly performs the steps 170 and 180 as mentioned above. The microcomputer 100 performs the fine tuning in the locked window region through the above mentioned processes. If the frequency offset ($f_o$) value read out at step 160 is within the predetermined range as a result of checking at step 170, this means that the local oscillation frequency of the NCO 68 and the frequency offset of the VSB signal are synchronized with the optimum frequency near "0", and thus the microcomputer 100 determines the currently set frequency as the optimum tuned frequency to complete the fine-tuning adjustment mode (step 190).

As a result, the frequency offset of the received signal in the television signal receiving system can be stably compensated for by performing the wide-range tracking adjustment mode and fine-tuning adjustment mode as mentioned above.

As described above, according to the present invention, a rough tracking is first performed by a high-speed search of the whole range of the maximum frequency offset which may occur during the reception of the television signal, and then the fine tuning is performed in the locked window region, thereby enabling an easy frequency tracking even in a case where the frequency offset range of the received signal is extended, as well as improving the performance of the carrier restoration and reception in the television signal receiving system.

While this invention has been described in connection with what is presently considered to be the most practical and preferred embodiment, it is to be understood that the invention is not limited to the disclosed embodiment, but, on the contrary, it is intended to cover various modifications within the spirit and scope of the appended claims.

What is claimed is:

1. An automatic frequency tracking method for a television signal receiving system for restoring a carrier including a pilot signal, comprising:

a tuning step of tuning a received television signal based upon an output of a frequency synthesizer;

a window region dividing step of dividing a maximum frequency offset range, which can occur in receiving a television signal, into a plurality of window regions, by changing the output of the frequency synthesizer according to values determined in a microcomputer to correspond to the respective window regions;

a wide-range tracking adjustment mode performing step of searching whether a lock signal of a frequency phase-locked loop is detected at representative frequencies of the respective divided window regions; and a fine-tuning adjustment mode performing step of determining tuned frequencies from the respective frequencies existing in one of the window regions in which the lock signal is detected, and when a frequency offset detected from the determined tuned frequencies has a value in a predetermined range, determining the corresponding tuned frequency as an optimum tuned frequency.

2. The automatic frequency tracking method of claim 1, wherein each of the window regions, divided in the window region dividing step, has the same size.

3. The automatic frequency tracking method of claim 2, wherein the size of each of the window regions is determined as a value which is smaller than a value of a carrier restoration range of the frequency phase-locked loop, but larger than half of said value of the carrier restoration range.

4. The automatic frequency tracking method of claim 2, wherein the divided window regions are numbered in an order of increasing separation from a central frequency in the maximum frequency offset range.

5. The automatic frequency tracking method of claim 2, wherein the divided window regions are numbered and the wide-range tracking adjustment mode performing step is performed so that the window regions are searched in a single direction within the maximum frequency offset range.

6. An automatic frequency tracking method for a digital television receiver having a carrier restorer for restoring a carrier including a pilot signal, comprising:

a tuning step of tuning a tuner to a tuned frequency based upon an output of a frequency synthesizer;

a variable initializing step of determining initial values of variables for compensating for a frequency offset;

a representative frequency computing step of computing representative frequencies of a plurality of window regions divided in a maximum frequency offset range, which can occur in receiving a television signal, by operating the initialized variables using a microcomputer;

a wide-range tracking adjustment mode performing step of changing the output of the frequency synthesizer to change the tuned frequency to the respective computed representative frequencies and searching whether a lock signal of a frequency phase-locked loop is detected at the respective computed representative frequencies; and a fine-tuning adjustment mode performing step of determining tuned frequencies from the frequencies existing in one of the window regions to which the corresponding representative frequency belongs when the frequency offset value at the representative frequency at which the lock signal is detected is not included in a predetermined range, and determining the corresponding tuned frequency as an optimum tuned frequency if the frequency offset value detected from the determined tuned frequency has a value in the predetermined range.

7. The automatic frequency tracking method of claim 6, wherein all the steps including the variable initializing step are performed whenever the power is initially supplied to the television receiver or a received channel is changed.

8. An automatic frequency tracking apparatus for a system for receiving a television signal including a pilot signal, comprising:

a tuner for tuning the received television signal with an intermediate frequency signal in accordance with input frequency adjustment data;

a surface acoustic wave (SAW) filter for filtering the tuned intermediate frequency signal to pass therethrough only a predetermined frequency range of the intermediate frequency signal;

frequency conversion means for frequency-converting an output of the SAW filter into a frequency range which can be digitally processed;

signal-conversion means for converting an output of the frequency conversion means into a digital signal;

a carrier restorer for frequency-converting an output of the signal conversion means into a baseband signal by converting the output of the signal conversion means into a complex signal and by multiplying the converted complex signal by an oscillation signal being shifted to a predetermined range, and detecting a frequency offset and a phase offset based on the pilot signal from the baseband complex signal;

a lock detector for producing a lock signal in an active state if the frequency of the pilot signal coincides with the oscillation signal being shifted to the predetermined range in the carrier restorer; and a control section for dividing a maximum frequency offset range which can occur in receiving the television signal into a plurality of window regions according to values determined in a microcomputer, and outputting frequency adjustment data for fine-tuning a tuned frequency of the tuner so that the frequency offset inputted from the carrier restorer becomes minimized if the active lock signal is detected at any one of representative frequencies in the divided window regions.

9. The automatic frequency tracking apparatus of claim 8, wherein the control section numbers the divided window regions in an order of increasing separation from a central frequency in the maximum. frequency offset range, and searches whether the lock signal is detected or not in the order of numbering.

* * * * *